US007189494B2

(12) United States Patent
Knight et al.

(10) Patent No.: US 7,189,494 B2
(45) Date of Patent: Mar. 13, 2007

(54) ON-PRESS DEVELOPABLE IMAGEABLE ELEMENT COMPRISING A TETRAARYLBORATE SALT

(75) Inventors: Elizabeth Knight, Lafayette, CO (US); Paul R. West, Fort Collins, CO (US)

(73) Assignee: Eastman Kodak Company, Rochester, NY (US)

( * ) Notice: Subject to any disclaimer, the term of this patent is extended or adjusted under 35 U.S.C. 154(b) by 0 days.

(21) Appl. No.: 11/138,026

(22) Filed: May 26, 2005

(65) Prior Publication Data

US 2006/0269873 A1 Nov. 30, 2006

(51) Int. Cl.
G03F 7/031 (2006.01)
(52) U.S. Cl. .................. 430/281.1; 430/302; 430/309; 430/434; 430/435; 430/944; 430/945
(58) Field of Classification Search ............. 430/270.1, 430/271.1, 281.1, 286.1, 287.1, 302, 309, 430/434, 435, 944, 945
See application file for complete search history.

(56) References Cited

U.S. PATENT DOCUMENTS

| | | | |
|---|---|---|---|
| 4,937,161 | A | 6/1990 | Kita et al. |
| 4,959,297 | A | 9/1990 | Palazzotto |
| 5,496,903 | A | 3/1996 | Watanabe et al. |
| 6,482,571 | B1 * | 11/2002 | Teng .......................... 430/302 |
| 6,576,401 | B2 | 6/2003 | Teng |
| 6,582,882 | B2 | 6/2003 | Pappas et al. |
| 6,630,555 | B2 | 10/2003 | Kendall et al. |
| 6,846,614 | B2 | 1/2005 | Timpe et al. |
| 2002/0114966 | A1 * | 8/2002 | Urano ......................... 428/522 |
| 2003/0064318 | A1 | 4/2003 | Huang et al. |
| 2003/0180655 | A1 * | 9/2003 | Fan et al. .................. 430/270.1 |
| 2004/0229165 | A1 | 11/2004 | Munnelly et al. |
| 2004/0260050 | A1 | 12/2004 | Munnelly et al |
| 2005/0003285 | A1 | 1/2005 | Hayashi et al |

FOREIGN PATENT DOCUMENTS

| | | |
|---|---|---|
| EP | 0 438 123 B1 | 1/1995 |
| EP | 1 467 250 A2 | 10/2004 |
| JP | 11-052562 | 2/1999 |
| JP | 2001-075276 | 3/2001 |
| JP | 2002-365788 | 12/2002 |
| JP | 2002-062642 | 2/2003 |
| JP | 2005-062482 A | 3/2005 |

OTHER PUBLICATIONS

JP Abstract 04-146905 (Showa Denko KK) Oct. 11, 1990.

"The 'onium butyltriphenylborates as novel donor-acceptor initiators for free radical photopolymerization" Toba et al, Chem. Commun. (1997) 7, pp. 675-676.

"Photo-initiated electron transfer reactions in dye-borate ion pairs: energy, distance and solvent dependence", Schuster et al, J. Photochem. Photobiol. A: Chem., 65 (1992) 191-196.

Electron-Transfer reactions in cyanine Borate Ion Pairs: Photopolymerization Initiators Sensitive to Visible Light:, Chatterjee et al., J. Am. Chem. Soc., (1988) 110, 2326-2328.

"Dimerization of cyanine dyes in water driven by association with hydrophobic borate anions", Armitage et al, J. Am. Chem. Soc. (1993) 115, pp. 10786-10790.

"Photochemistry of organoborates: intra-ion pair eletron transfer to cyanines", G.Schuster; Pure& Appl. Chem (1990) 62(8), 1565-1572.

"Photochemical properties of 4-benzoylbenzylammonium borates", Zhang et al., J. Org. Chem. (1999), 64 pp. 458-463.

"Styrylpyridinium borate salts as dye photointiators of free-radical polymerization", Jedrzejewska et al., J. PolymerScience Part A: Polymer Chemistry. (2002) 40, pp. 1433-1440.

"Tetraarylborates $\{[Ar]_4B-\}$:Estimation of Oxidation Potentials and Reorganization Energies from electron-transfer rates", Murphy et al., J. Phys. Chem. (1993) 97, pp. 13152-13157.

"Photochemistry of carbocyanine alkyltriphenylborate salts: intra-ion pair electron transfe and the chemistry of boranyl radicals", Chatterjee et al., J. Am. Chem. Soc. (1990) 112, pp. 6329-6338.

"Reactivities of Chromophore-containing methyl tri-n-butylammonium organobrate slats as free radical photoinitiaotrs: dependence on the chromophore and borate counterion", Hu et al., Macromolecules (1998) 31, pp. 6476-6480.

"Syntheses and study of iodonium boate salts as photoinitiators", Feng et al, RadTech'98 North America UV/EB Conferenace Proeedings, Chicago, Apr. 19-22, 1998—abstract.

* cited by examiner

*Primary Examiner*—Barbara L. Gilliam
(74) *Attorney, Agent, or Firm*—J. Lanny Tucker

(57) ABSTRACT

The present invention provides an imageable element including a lithographic substrate and an imageable layer disposed on the substrate. The imageable layer includes a radically polymerizable component, an initiator system, and a polymeric binder. The imageable element further includes a tetraarylborate salt. The presence of the tetraarylborate salt may provide improved imaging speed and may enhance press life due to better adhesion between the imageable layer and the substrate. The tetraarylborate salt may be present in the imageable layer, an interlayer, or a separate layer between the substrate and the imageable layer. The imageable element may be imaged and mounted on-press without a separate development step.

20 Claims, No Drawings

ON-PRESS DEVELOPABLE IMAGEABLE ELEMENT COMPRISING A TETRAARYLBORATE SALT

TECHNICAL FIELD

The present invention relates to imageable elements useful as lithographic printing plate precursors. In conventional or "wet" lithographic printing, ink-receptive regions, known as image areas, are generated on a hydrophilic surface of a lithographic substrate to produce a printing plate. When the surface of the printing plate is moistened with water and ink is applied, the hydrophilic regions retain water and repel ink, and the ink-receptive regions accept ink and repel water. The ink is transferred to the surface of a medium upon which the image is to be reproduced. Typically, the ink is first transferred to an intermediate blanket, which in turn transfers the ink to the surface of the medium upon which the image is to be reproduced.

Imageable elements useful as precursors for lithographic printing plates typically comprise an imageable layer applied over the hydrophilic surface of a substrate. The imageable layer includes one or more radiation-sensitive components, often dispersed in a suitable binder. Following imagewise exposure, either the exposed regions or the unexposed regions of the imageable layer are removed by a suitable developer, revealing the underlying hydrophilic surface of the substrate. If the exposed regions are removed, the precursor is positive-working. Conversely, if the unexposed regions are removed, the precursor is negative-working. In each instance, the regions of the imageable layer (i.e., the image areas) that remain are ink-receptive, and the regions of the hydrophilic surface revealed by the developing process accept water and aqueous solutions, typically a fountain solution, and do not accept ink.

Conventional imaging of the imageable element with ultraviolet and/or visible imaging radiation can be carried out through a mask having transparent and opaque regions. The mask is placed in direct contact with the imageable element, and ultraviolet imaging radiation is directed through the mask. The regions of the imageable element under the transparent regions of the mask are exposed, while the regions under the opaque regions of the mask are unexposed.

However, direct digital imaging, which obviates the need for imaging through a mask, is becoming increasingly prevalent in the printing industry. In particular, imageable elements for the preparation of lithographic printing plates have been developed for imaging with infrared lasers. High-performance lasers or laser diodes which are used in commercially available image-setters generally emit light in the wavelength ranges of between 800 to 850 nm or between 1060 and 1120 nm. Such a laser beam can be digitally controlled via a computer; i.e. the laser can be turned on or off so that an imagewise exposure of the precursor can be effected via stored digitized information in the computer.

Therefore, printing plate precursors, or initiator systems contained therein, which are to be imagewise exposed by means of such image-setters need to be sensitive in the near-infrared region of the spectrum. Such printing plate precursors can then be handled under daylight conditions which significantly facilitates their production and processing.

Imaged elements typically require processing in a developer to convert them to lithographic printing plates. Developers are typically aqueous alkaline solutions, which may also contain substantial amounts of organic solvents. Because of high pH and the presence of organic solvents, disposal of substantial quantities of used developer is expensive and can cause environmental problems. Processing of the imaged element in a developer also introduces additional costs in the cost of the developer, the cost of the processing equipment, and the labor costs for operating the process.

On-press developable lithographic printing plate precursors can be directly mounted on a press after imaging, and are developed through contact with ink and/or fountain solution during the initial press operation. Such precursors do not require a separate development step before mounting on press. On-press imaging, in which the precursor is both imaged and developed on press, eliminates the need to mount the precursor in a separate imaging device.

SUMMARY OF THE INVENTION

The present invention relates to a negative-working imageable element including a lithographic substrate and an imageable layer disposed on the substrate. The imageable layer includes a radically polymerizable component, an initiator system capable of generating radicals sufficient to initiate a polymerization reaction upon exposure to imaging radiation, and a polymeric binder. The imageable element further includes a tetraarylborate salt. The tetraarylborate salt may be present in the imageable layer, or may be in a separate layer.

The presence of the tetraarylborate salt may provide improved imaging speed and may enhance press life due in part to better adhesion between the imageable layer and the substrate.

After exposure, the imaged element can be mounted directly on press, without an intermediate development step. In some embodiments, the imageable element can be both imaged and developed on-press.

In one embodiment, the present invention provides an imageable element including a lithographic substrate and an imageable layer disposed on the substrate. The imageable layer includes a radically polymerizable component, an initiator system capable of generating radicals sufficient to initiate a polymerization reaction upon exposure to imaging radiation, and a polymeric binder. The imageable element further comprises a tetraarylborate salt.

In one embodiment, the tetraarylborate salt is present in the imageable layer. In another embodiment, the imageable element includes an interlayer between the imageable layer and the substrate, and the tetraarylborate salt is present in the interlayer. In yet another embodiment, the imageable element comprises a separate layer between the imageable layer and the substrate, wherein the separate layer consists essentially of the tetraarylborate salt.

The invention further provides methods for making an imageable element, and methods for making a printing plate. The invention also includes a printing plate made using the imageable element described above, and a method for printing.

DETAILED DESCRIPTION OF THE INVENTION

Unless the context indicates otherwise, in the specification and claims, the terms photothermal conversion material, copolymer, co-binder, monomer and co-monomer, macromer, and similar terms also include mixtures and combinations of such materials. Unless otherwise specified, all percentages are percentages by weight.

For clarification of definitions for any terms relating to polymers, please refer to "Glossary of Basic Terms in Polymer Science" as published by the International Union of Pure and Applied Chemistry ("IUPAC"), *Pure Appl. Chem.* 68, 2287–2311 (1996). However, any definitions explicitly set forth herein should be regarded as controlling.

On-press imageable elements are known in the art. For example, U.S. Pat. No. 6,582,882 to Pappas, et al. reports a thermally imageable composition comprising a copolymer having polyethylene oxide side chains. This reference does not, however, report a composition comprising polymerizable components or initiators.

U.S. Pat. No. 6,846,614 to Timpe, et al. (the disclosure of which is incorporated by reference in its entirety) reports an infrared-sensitive composition comprising a first polymeric binder which does not comprise acidic groups, a second polymeric binder comprising polyether groups, an initiator system, and a free radical polymerizable system. The second binder can be a polyalkylene ether polymer or copolymer, such as a block copolymer of polyethylene oxide and polypropylene oxide.

Co-pending U.S. patent application Ser. No. 10/119,454 (U.S. Pub. App. 2003/0064318) of Huang, et al. (the disclosure of which is incorporated by reference in its entirety) reports a polymerizable coating composition comprising a polymerizable compound and a polymeric binder comprising polyethylene oxide segments. The binder can be a block copolymer having a polyethylene oxide block, or a graft copolymer having polyethylene oxide side chains.

Co-pending U.S. patent application Ser. No. 10/436,506 (U.S. Pub. App. 2004/0229165) of Munnelly, et al. (the disclosure of which is incorporated by reference in its entirety) reports a polymerizable coating composition comprising a polymerizable compound, an initiator system comprising an onium salt and an infrared absorber, and a polymeric binder comprising polyethylene oxide segments.

Co-pending U.S. patent application Ser. No. 10/872,209 (U.S. Pub. App. 2005/0003285) of Hayashi, et al. (the disclosure of which is incorporated by reference in its entirety) reports an imageable element having an imageable layer including a radically polymerizable component, an initiator system, and a polymeric binder having a hydrophobic backbone and including both pendant cyano groups and pendant groups including a hydrophilic poly(alkylene oxide) segment.

Co-pending U.S. patent application Ser. No. 10/891,727 (U.S. Pub. App. 2004/0260050) of Munnelly, et al. (the disclosure of which is incorporated by reference in its entirety) reports a method for preparing a copolymeric binder having a hydrophobic backbone and including pendant cyano groups, pendant aryl groups, and pendant groups including a hydrophilic poly(alkylene oxide) segment. The method involves co-polymerization of appropriate monomers in a solvent mixture of a ($C_1$–$C_6$) alkanol and water in the presence of a polymerization initiator.

In one embodiment, the present invention provides an imageable element including a lithographic substrate and an imageable layer disposed on the substrate. The imageable element further comprises a tetraarylborate salt.

The invention further provides methods for making an imageable element, and methods for making a printing plate. The invention also includes a printing plate made using the imageable element, and a method for printing.

Imageable Element

In one embodiment, the present invention provides an imageable element including a lithographic substrate and an imageable layer disposed on the substrate. The imageable element is negative-working. The imageable layer includes a radically polymerizable component, an initiator system capable of generating radicals sufficient to initiate a polymerization reaction upon exposure to imaging radiation, and a polymeric binder. In some embodiments, the binder is a polymeric binder having a hydrophobic backbone and constitutional units having a pendant group including a hydrophilic poly(alkylene oxide) segment. In other embodiments, the binder has a hydrophobic backbone and includes both constitutional units having a pendant cyano group attached directly to the hydrophobic backbone, and constitutional units having a pendant group including a hydrophilic poly(alkylene oxide) segment. The imageable element further includes a tetraarylborate salt.

The lithographic substrate, imageable layer, and tetraarylborate salt are described further below.

In some embodiments, no layers other than the imageable layer are utilized in the imageable element. However, in other embodiments the imageable element may further include an overlying layer. At least one function of an overlying layer is to serve as an oxygen barrier layer that prevents the diffusion of oxygen from the atmosphere into the imageable layer. The overlying layer should be soluble, dispersible in, or at least swellable by or permeable to the developer. Other functions of an overlying layer may include: to prevent damage, such as scratching, of the surface layer during handling prior to imagewise exposure; to prevent damage to the surface of the imagewise exposed areas, for example, by over-exposure which could result in partial ablation; and to facilitate developability of the unexposed areas.

In some embodiments, the imageable element can include a layer underlying the imageable layer. Functions of an underlying layer may include: to enhance developability of the imagewise unexposed areas; and to act as a thermal insulating layer for the imagewise exposed areas. Such a thermal insulating polymeric layer prevents otherwise rapid heat dissipation, for example, through a heat-conducting substrate. In accordance with these functions, the underlying layer should be soluble or at least dispersible in the developer and, preferably, have relatively low thermal conductivity.

In one embodiment, the tetraarylborate salt is present in the imageable layer. In another embodiment, the imageable element includes an interlayer between the imageable layer and the substrate, and the tetraarylborate salt is present in the interlayer. In yet another embodiment, the imageable element comprises a separate layer between the imageable layer and the substrate, consisting essentially of the tetraarylborate salt.

Lithographic Substrate

The lithographic substrate acts as a support, and may be any material conventionally used for the preparation of lithographic printing plates. In general, a suitable lithographic substrate will have a hydrophilic surface on which the imageable layer is disposed.

The substrate material should be strong, stable, and flexible. It should resist dimensional change under conditions of use so that color records will register in a full-color image. Typically, it can be any self-supporting material, including, for example, polymeric films such as polyethylene terephthalate film, ceramics, metals, or stiff papers, or a lamination of any of these materials. Suitable metal materials include, for example, aluminum, zinc, titanium, and alloys thereof. The back side of the lithographic substrate (i.e., the side opposite the imageable layer) may be coated with an antistatic agent and/or a slipping layer or matte layer to improve handling and "feel" of the imageable element.

Typically, when the substrate material is a polymeric film, it will contain a sub-coating on one or both surfaces to modify the surface characteristics. For example, the polymeric film may be coated to enhance the hydrophilicity of the surface, to improve adhesion to overlying layers, to improve planarity of paper substrates, and the like. The nature of this coating depends upon the substrate and the composition of subsequent layers. Examples of subbing materials are adhesion-promoting materials, such as alkoxysilanes, aminopropyltriethoxysilane, glycidoxypropyltriethoxysilane and epoxy functional polymers, as well as conventional subbing materials used on polyester bases in photographic films.

One particularly suitable lithographic substrate is a hydrophilic aluminum substrate. Generally an aluminum support will be surface-treated by techniques known in the art, including physical graining, electrochemical graining, chemical graining, and anodizing. If the surface is roughened, the average roughness (Ra) is preferably in the range from 0.1 to 0.8 μm, and more preferably in the range from about 0.1 to about 0.4 μm.

Conventional anodization techniques include sulfuric acid anodization and phosphoric acid anodization, for example. Anodic pore size for sulfuric acid anodization is typically less than 20 nm whereas anodic pore size for phosphoric acid anodization is typically greater than 30 nm. The use of large anodic pore substrates that are phosphoric acid anodized is preferred over sulfuric acid-anodized substrates. Other conventional anodization methods can also be used in the preparation of the anodized substrate of the present invention, including particularly those that produce an anodic pore size larger than anodic pore size produced by sulfuric acid anodization. Methods in which a substrate is anodized using a combination of acids, such as in a mixture of acids (such as a mixture of phosphoric acid and sulfuric acid), or sequentially anodized using more than one acid (such as phosphoric acid anodization followed by sulfuric acid anodization, or vice versa), are also suitable.

The substrate should be of sufficient thickness to sustain wear from printing and be thin enough to wrap around a cylinder in a printing press, typically about 100 μm to about 600 μm.

An aluminum lithographic substrate may comprise an interlayer between the aluminum support and any overlying layers. The interlayer may be formed by treatment of the aluminum support with, for example, silicate, dextrin, hexafluorosilicic acid, phosphate/fluoride, poly(acrylic acid) (PAA), poly(vinyl phosphonic acid) (PVPA), vinyl phosphonic acid co-polymers, or a water-soluble diazo resin. Interlayer treatments are known to those skilled in the art.

In one embodiment of the invention, the interlayer also includes the tetraarylborate salt. In the practice of this embodiment, the tetraarylborate salt may be included as an additive in a composition that is used for the interlayer treatment. For example, a composition comprising about 20 parts to about 80 parts tetraarylborate salt per hundred parts solids may be suitable for an interlayer treatment. By way of example only, a composition comprising equal parts poly (acrylic acid) and a tetraarylborate salt in a coating solvent (such as water) containing a small amount of surfactant is suitable for an interlayer treatment (see Example E38, below).

In another embodiment of the invention, the imageable element comprises a separate layer between the imageable layer and the substrate. The separate layer may be used in place of an interlayer, or may be used in addition to an interlayer. The separate layer may consist essentially of the tetraarylborate salt (such as is demonstrated in Example E37, below), or may include other components. By way of example, the separate layer may include about 80 to 100 parts tetraarylborate salt per hundred parts solid. A separate layer containing the tetraarylborate salt may be applied using conventional coating techniques.

Imageable Layer

The imageable layer comprises a polymerizable composition including a polymerizable component, an initiator system, and a polymeric binder. The polymerizable composition typically comprises about 10 wt.-% to about 70 wt.-%, more suitably about 20 wt.-% to about 60 wt.-%, and most suitably about 30 wt.-% to about 50 wt.-% of the polymerizable component. The polymerizable composition also includes about 10 wt.-% to about 80 wt.-%, more suitably about 20 wt.-% to about 50 wt.-%, and most suitably about 30 wt.-% to about 40 wt.-% of binder. The polymerizable composition further includes about 0.01 wt.-% to about 20 wt.-%, more suitably about 0.1 wt.-% to about 10 wt.-%, of the initiator system.

In one embodiment of the invention, the imageable layer also includes the tetraarylborate salt. When the tetraarylborate salt is included in the imageable layer, the imageable layer generally comprises about 0.5 wt.-% to about 20 wt.-%, more suitably about 1 wt.-% to about 10 wt.-%, of the tetraarylborate salt. However, in other embodiments the imageable layer is free from the tetraarylborate salt, such as where the tetraarylborate salt is in an interlayer or separate layer.

Other conventional ingredients, such as surfactants and contrast dyes, may be included in the polymerizable composition. The polymerizable composition may optionally include up to 25 wt.-%, more suitably about 0 wt.-% to about 15 wt.-%, of other ingredients.

By way of example, an additive for extending shelf life of the imageable layer may be included. Examples of additives that may be effective for extending shelf life include mercapto compounds, amino compounds, and monocarboxylic or polycarboxylic acids. Suitable mercapto compounds are described in U.S. Pat. No. 6,884,568 to Timpe, et al. (the disclosure of which is incorporated by reference in its entirety), for example. U.S. Pat. No. 6,309,792 to Hauck, et al. describes suitable polycarboxylic acids that have an aromatic moiety substituted with a heteroatom. U.S. patent application Ser. No. 10/283,757 (U.S. Pub. App. 2004/0091811) of Munnelly, et al. and U.S. patent application Ser. No. 10/847,708 (U.S. Pub. App. 2004/0259027) of Munnelly, et al. describe suitable monocarboxylic acid additives.

Also by way of example, an additive for reducing the white-light sensitivity of the imageable layer may be included. Examples of additives that may be effective include UV absorbers such as UVSOB 340 (2-hydroxy-4-methoxy benzophenone-5-sulfonic acid) available from LC United Chemical Corp. (Taiwan) and CIBAFAST W (5-benzotriazolyl-4-hydroxy-3-sec-butyl-benzenesulfonic acid) available from Ciba Specialty Chemicals (Tarrytown, N.Y.). Antioxidants such as hindered phenols may also be effective to reduce white-light sensitivity. Examples of phenolic-based antioxidants include IRGANOX 1035 and IRGANOX 1076 available from Ciba Specialty Chemicals.

Polymerizable Component

The imageable layer comprises a polymerizable or crosslinkable component. The polymerization or crosslinking of the polymerizable or crosslinkable component may be radically initiated, for example.

The polymerizable or crosslinkable component includes at least one ethylenically unsaturated compound that undergoes free radical-initiated polymerization or crosslinking. The ethylenically unsaturated compound can be a polymerizable monomer, for instance. Suitable monomers are typically multifunctional, i.e., they comprise more than one ethylenically unsaturated, free radical polymerizable group. Typical multifunctional monomers are unsaturated esters of alcohols, preferably acrylate and methacrylate esters of polyols. Oligomers and/or prepolymers, such as urethane acrylates and methacrylates, epoxide acrylates and methacrylates, polyester acrylates and methacrylates, polyether acrylates and methacrylates and unsaturated polyester resins, may also be used.

Numerous other unsaturated monomers polymerizable by free-radical initiated polymerization and useful in polymerizable compositions are known to those skilled in the art and are described, for example, in *Photoreactive Polymers: The Science and Technology of Resists*, A. Reiser, Wiley, N.Y., 1989, pp. 102–177; in "Photopolymers: Radiation Curable Imaging Systems," by B. M. Monroe, in *Radiation Curing: Science and Technology*, S. P. Pappas, Ed., Plenum, N.Y., 1992, pp. 399–440; and "Polymer Imaging" by A. B. Cohen and P. Walker, in *Imaging Processes and Material*, J. M. Sturge, et al., Eds., Van Nostrand Reinhold, N.Y., 1989, pp. 226–262.

The polymerizable component of the invention is present in sufficient amount to render imaged areas insoluble in an aqueous developer after exposure to heat or radiation. The weight ratio of polymerizable component to binder ranges from about 5:95 to about 95:5, preferably from about 10:90 to about 90:10, more preferably from about 20:80 to about 80:20, most preferably from about 30:70 to about 70:30.

Initiator System

The polymerizable composition includes an initiator system for initiating a polymerization reaction upon imagewise exposure of the imageable element. Upon exposure to heat or radiation, the initiator system generates free radicals to initiate the polymerization reaction. The initiator system may be responsive, for example, to electromagnetic radiation in the ultraviolet, visible and/or infrared spectral regions, corresponding to the spectral range of about 300–1400 nm.

Suitable initiator systems will be recognized by those skilled in the art. In some embodiments, the initiator system comprises a compound (or compounds) that generates free radicals when the imageable element is thermally imaged. Thermally sensitive free radical generators include, for example, peroxides such as benzoyl peroxide; hydroperoxides such as cumyl hydroperoxide; azo compounds such as azo bis-isobutyronitrile; 2,4,5-triarylimidazolyl dimers (hexaarylbisimidazoles) such as are disclosed in Dueber, et al., U.S. Pat. No. 4,565,769; trihalomethyl triazines; alkylborate salts (i.e., comprising at least one alkyl group bonded to the boron center); and onium salts, for example, diazonium salts, iodonium salts, sulfonium salts, phosphonium salts, and pyridinium salts; and mixtures thereof. Diaryliodonium salts and triarylsulfonium salts are especially suitable onium salts. The polymerizable composition typically comprises about 0.5 to about 7 wt.-% of a radical-generating compound.

Especially suitable initiator systems for use in the practice of the present invention are described in co-pending U.S. patent application Ser. No. 10/436,506 (U.S. Pub. App. 2004/0229165), which is incorporated by reference in its entirety.

In some embodiments, the initiator system is sensitive to infrared radiation. The infrared radiation may be in the range from about 800 to about 1200 nm, for example. An imageable layer that is to be imaged with infrared radiation typically comprises an infrared absorber, known as a "photothermal conversion material." Photothermal conversion materials absorb radiation and convert it to heat. Although a photothermal conversion material is not necessary for imaging with a hot body, imageable elements that contain a photothermal conversion material may also be imaged with a hot body, such as a thermal head or an array of thermal heads.

The photothermal conversion material may be any material that can absorb radiation and convert it to heat. Suitable materials include dyes and pigments. Suitable pigments include, for example, carbon black, Heliogen Green, Nigrosine Base, iron (III) oxide, manganese oxide, Prussian Blue, and Paris blue. The size of the pigment particles should not be more than the thickness of the layer that contains the pigment. Most suitably, the size of the particles will be half the thickness of the layer or less. The amount of photothermal conversion material present in the imageable layer is generally sufficient to provide an optical density of at least 0.05, and preferably, an optical density of from about 0.5 to at least about 2 to 3 at the imaging wavelength. The polymerizable composition typically comprises about 0.5 to about 7 wt.-% of a photothermal conversion material.

The photothermal conversion material may include a dye with the appropriate absorption spectrum and solubility. Dyes, especially dyes with a high extinction coefficient in the range of 750 nm to 1200 nm, are preferred. Examples of suitable dyes include dyes of the following classes: methine, polymethine, arylmethine, cyanine, hemicyanine, streptocyanine, squarylium, pyrylium, oxonol, naphthoquinone, anthraquinone, porphyrin, azo, croconium, triarylamine, thiazolium, indolium, oxazolium, indocyanine, indotricarbocyanine, oxatricarbocyanine, phthalocyanine, thiocyanine, thiatricarbocyanine, merocyanine, cryptocyanine, naphthalocyanine, polyaniline, polypyrrole, polythiophene, chalcogenopyryloarylidene and bis(chalcogenopyrylo)polymethine, oxyindolizine, pyrazoline azo, and oxazine classes. Infrared-absorbing dyes are disclosed in numerous publications, for example, European Patent App. 0 823 327 of Nagasaka, et al., U.S. Pat. No. 4,973,572 to DeBoer, and U.S. Pat. No. 5,208,135 to Patel, et al. Other examples of useful infrared-absorbing dyes include ADS-830A and ADS-1064 available from American Dye Source, Inc. (Baie D'Urfe, Quebec, Canada).

For imageable elements that are to be developed by contact with ink and/or fountain solution, water-soluble photothermal conversion materials may be suitable. Water-soluble photothermal conversion materials include, for example, cyanine dyes which one or more sulfate and/or sulfonate groups. Infrared-absorbing cyanine anions that contain two to four sulfonate groups are reported, for example, in U.S. Pat. No. 5,107,063 to West, et al., U.S. Pat. No. 5,972,838 to Pearce, et al., U.S. Pat. No. 6,187,502 to Chapman, et al., and U.S. Pat. No. 5,330,884 to Fabricius, et al.

In other embodiments, the initiator system includes an ultraviolet, visible or infrared absorber as a photosensitizer, and an electron acceptor capable of producing free radicals. The initiator system may also include a coinitiator capable of donating an electron and/or hydrogen atom and/or of forming a free radical. Examples of such initiator systems include: trihalomethyl triazines alone or together with a separate photosensitizer, for example, as described in U.S. Pat. No. 4,997,745 to Kawamura, et al.; spectral sensitizers for visible light activation, together with trihalomethyl triazines, as described, for example in U.S. Pat. No. 5,599,650 to Bi, et al.; 3-ketocoumarins, for ultraviolet and visible light activation, together with a polycarboxylic acid coinitiator, such as anilino-N,N-diacetic acid, and a secondary coinitiator, such as diaryliodonium salts, titanocenes, haloalkyl triazines, hexaaryl bisimidizoles, borate salts and photooxidants containing a heterocyclic nitrogen atom that is substituted by an alkoxy or acyloxy group, as described in U.S. Pat. No. 5,942,372 to West, et al.; a cyanine dye, diaryliodonium salt and a coinitiator having a carboxylic acid group bonded via a methylene group to a N, O or S group, which is directly attached to an aromatic ring, as described in U.S. Pat. No. 5,368,990 to Kawabata, et al.; a cyanine dye, for infrared radiation activation, together with a trihalomethyl triazine and an organoboron salt, as described in U.S. Pat. No. 5,496,903 to Watanabe, et al.; an infrared radiation absorber, a compound capable of producing an initiating free radical, including trichloromethyl triazines and azinium compounds and a polycarboxylic acid coinitiator having a carboxylic acid group bonded via a methylene group to a N, O S group, which is directly attached to an aromatic ring, as described in U.S. Pat. No. 6,309,792 to Hauck, et al.

Binder

The polymerizable composition of the imageable layer also comprises a polymeric binder. Numerous suitable binders are known in the art. A combination of binders may also be employed. In some embodiments, the binder is a polymeric binder having a hydrophobic backbone and constitutional units having a pendant group including a hydrophilic poly(alkylene oxide) segment. In other embodiments, the polymeric binder includes a plurality of constitutional units having pendant cyano groups (—C≡N) attached directly to the hydrophobic backbone. In some embodiments, the imageable layer includes a combination of binders, which may include an optional "co-binder" (described below) not meeting the foregoing description.

The polymerizable composition includes about 10 wt.-% to about 80 wt.-%, more suitably about 20 wt.-% to about 50 wt.-%, and most suitably about 30 wt.-% to about 40 wt.-% of total binder (i.e., total quantity of binder and co-binders). The total binder is generally present in sufficient amount to render the photopolymerizable composition soluble or dispersible in an aqueous developer. From 0 wt.-% to about 50 wt.-%, more suitably from about 1 wt.-% to about 30 wt.-% of the polymerizable composition, may be the co-binder(s).

The polymeric binder is generally a solid at room temperature, and is typically a non-elastomeric thermoplastic. For on-press developability, a polymeric binder comprising both hydrophilic and hydrophobic regions may be suitable. Although not bound by any theory, the combination of hydrophobic and hydrophilic regions is thought to be important for enhancing differentiation of the exposed and unexposed areas, to facilitate developability.

Suitable polymeric binders are described, for example, in U.S. Pat. No. 6,582,882, in co-pending U.S. patent application Ser. No. 10/119,454 (U.S. Pub. App. 2003/0064318), and in U.S. patent application Ser. No. 10/872,209 (U.S. Pub. App. 2005/0003285), each which is incorporated by reference in its entirety.

Generally the polymeric binder is characterized by a number average molecular weight ($M_n$) in the range from about 10,000 Da to about 250,000 Da, more commonly in the range from about 25,000 Da to about 200,000 Da. The polymerizable composition may comprise discrete particles of the polymeric binder. Preferably, the discrete particles are particles of the polymeric binder which are suspended in the polymerizable composition. The average diameter of the particles in the suspension may be in the range from about 0.01 micron to about 1 micron, more suitably in the range from about 100 nm to about 700 nm. In some embodiments, the average diameter of the particles in the suspension is in the range from about 150 nm to about 250 nm. The presence of discrete particles tends to promote developability of the unexposed areas.

The polymeric binder may be an addition polymer or a condensation polymer. Addition polymers may be prepared from acrylate and methacrylate esters, acrylic and methacrylic acid, methyl methacrylate, allyl acrylate and methacrylate, acrylamides and methacrylamides, acrylonitrile and methacrylonitrile, styrene, hydroxystyrene or a combination thereof, for example. Suitable condensation polymers include polyurethanes, epoxy resins, polyesters, polyamides and phenolic polymers, including phenol/formaldehyde and pyrogallol/acetone polymers.

For some embodiments, the polymeric binder has a hydrophobic backbone (or main chain), and includes constitutional units having attached pendant groups. In some embodiments, the hydrophobic backbone is an all-carbon backbone, such as where the polymeric binder is a copolymer derived from a combination of ethylenically unsaturated monomers. In other embodiments, the hydrophobic backbone may include heteroatoms, such as where the polymeric binder is formed by a condensation reaction or some other means.

In some embodiments, the binder is a polymeric binder having a hydrophobic backbone and constitutional units having a pendant group including a hydrophilic poly(alkylene oxide) segment. The poly(alkylene oxide) segment can be an oligomer or polymer containing a block of alkylene oxide constitutional units, for example. Generally, the pendant group will be predominantly the poly(alkylene oxide) segment (or more than one such segment), but may also comprise connecting groups and terminal groups.

In some embodiments, the alkylene oxide constitutional units are ($C_1$–$C_6$) alkylene oxide groups, more typically ($C_1$–$C_3$) alkylene oxide groups. For example, the poly (alkylene oxide) segment can comprise straight or branched alkylene oxide groups comprising 1 to 3 carbons, including —[$CH_2O$—], —[$CH_2CH_2O$—], —[$CH(CH_3)O$—], —[$CH_2CH_2CH_2O$—], —[$CH(CH_3)CH_2O$—], —[$CH_2CH(CH_3)O$—], or substituted versions of any of the foregoing. In some embodiments, the poly(alkylene oxide) segment consists of such constitutional units. In one embodiment, the poly(alkylene oxide) segment consists of —[$CH_2CH_2O$—] constitutional units.

The poly(alkylene oxide) segments typically comprise a total of about 5 to about 150 alkylene oxide constitutional units. Generally the number average molecular weight (Mn) of the poly(alkylene oxide) segments ranges from about 300 to about 10,000 Da, more suitably from about 500 Da to about 5,000 Da, and typically from about 1000 Da to about 3,000 Da.

One example of a suitable pendant group including a poly(alkylene oxide) segment is a pendant group of the form:

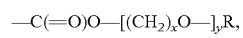

where x is 1 to 3, y is in the range from about 5 to about 150, and where R is a suitable terminal group. Suitable terminal groups R may include, as non-limiting examples, alkyl groups of one to six carbon atoms, such as methyl, ethyl, n-propyl, iso-propyl, n-butyl, sec-butyl, iso-butyl, t-butyl, n-pentyl, iso-pentyl, neo-pentyl, n-hexyl, iso-hexyl, 1,1-dimethyl-butyl, 2,2-dimethyl-butyl, cyclopentyl, and cyclohexyl.

A particular example of a suitable pendant group including a poly(alkylene oxide) segment is a pendant group of the form:

—C(=O)O—[CH$_2$CH$_2$O—]$_y$CH$_3$, where y is in the range from about 10 to about 100, and more suitably y is in the range from about 25 to about 75. In one embodiment, y is in the range from about 40 to about 50.

In a particular embodiment of the invention, the main chain of the polymeric binder of the invention also comprises constitutional units derived from other suitable polymerizable monomers or oligomers. For example, the polymeric binder may comprise constitutional units derived from acrylate esters, methacrylate esters, styrene, hydroxystyrene, acrylic acid, methacrylic acid, methacrylamide, or a combination of any of the foregoing. Especially suitable are constitutional units derived from styrene or methacrylamide. Also suitable are constitutional units derived from methyl methacrylate or allyl methacrylate. In particular, constitutional units having pendant unsubstituted or substituted phenyl groups attached directly to the hydrophobic backbone may be useful. Substituted phenyl groups include, for example, 4-methylphenyl, 3-methylphenyl, 4-methoxyphenyl, 4-cyanophenyl, 4-chlorophenyl, 4-fluorophenyl, 4-acetoxyphenyl, and 3,5-dichlorophenyl. Such constitutional units may be derived from styrene or substituted styrenic monomers, for instance.

In some embodiments, the polymeric binder includes constitutional units having pendant groups that contain siloxane functionality. Suitable polymeric binders, and the preparation thereof, are described in copending U.S. patent application Ser. No. 10/842,111 (U.S. Pub. App. 2004/0259027).

The polymeric binder generally includes only a small fraction of constitutional units having a pendant group including a hydrophilic poly(alkylene oxide) segment. Generally from about 0.1 to about 5 mol-%, and typically from about 0.5 to about 2 mol-%, of the total constitutional units in the polymeric binder have a pendant group including a hydrophilic poly(alkylene oxide) segment.

In other embodiments, the binder has a hydrophobic backbone, pendant cyano groups attached to the hydrophobic backbone, and pendant groups including a hydrophilic poly(alkylene oxide) segment. In these embodiments, the binder includes a plurality of constitutional units having pendant cyano groups (—C≡N) attached directly to the hydrophobic backbone. By way of example only, constitutional units having pendant cyano groups include —[CH$_2$CH(C≡N)—] and —[CH$_2$C(CH$_3$)(C≡N)—].

Constitutional units having pendant cyano groups can derive from ethylenically unsaturated monomers such as acrylonitrile or methacrylonitrile, for example, or from a combination thereof. As used herein, the term "(meth) acrylonitrile" indicates that either acrylonitrile or methacrylonitrile, or a combination of acrylonitrile and methacrylonitrile, is suitable for the stated purpose.

In some embodiments of the invention, the polymeric binder is a copolymer derived from (meth)acrylonitrile as one co-monomer. However, constitutional units having pendant cyano groups can also be introduced into the polymer by other conventional means. By way of example, the polymeric binder may be a copolymer derived from a cyanoacrylate monomer, such as methyl cyanoacrylate or ethyl cyanoacrylate. In an alternative embodiment, the polymeric binder may be derived from a combination of (meth) acrylonitrile and a cyanoacrylate monomer.

In the polymeric binder of these embodiments, a large percentage of the total recurring units include pendant cyano groups. Generally from about 70 to about 99.9 mol-%, and typically from about 75 to about 95 mol-%, of the total constitutional units in the polymeric binder include pendant cyano groups attached directly to the hydrophobic backbone.

In one embodiment, the polymeric binder is a random copolymer consisting essentially of: i) the constitutional units having a pendant cyano group attached directly to the hydrophobic backbone; ii) the constitutional units having pendant groups including a hydrophilic poly(alkylene oxide) segment; and iii) constitutional units having pendant unsubstituted or substituted phenyl groups attached directly to the hydrophobic backbone. In another embodiment, the polymeric binder is a random copolymer consisting essentially of: i) constitutional units of the form —[CH$_2$C(R)(C≡N)—]; ii) constitutional units of the form [CH$_2$C(R)(PEO)—], wherein PEO represents a pendant group of the form —C(=O)O—[CH$_2$CH$_2$O—]$_y$CH$_3$, wherein y is in the range from about 25 to about 75; and iii) constitutional units of the form: —[CH$_2$CH(Ph)—]; wherein each R independently represents —H or —CH$_3$, and Ph represents a pendant phenyl group. In yet another embodiment, the polymeric binder is a random copolymer in which about 70 to about 99.9 mol-% of the total constitutional units in the random copolymer are of the form —[CH$_2$C(R)(C≡N)—]; about 0.1 to about 5 mol-% of the total constitutional units in the random copolymer are constitutional units of the form —[CH$_2$C(R)(PEO)—]; and about 2 to about 20 mol-% of the total constitutional units in the random copolymer are of the form —[CH$_2$CH(Ph)—].

The polymeric binder described above is typically a random copolymer obtained by a free-radical copolymerization of co-monomers. In a typical preparation, a mixture of at least two co-monomers, one that is a precursor of the constitutional units having pendant cyano groups, another that is a precursor of the constitutional units having a pendant group including the poly(alkylene oxide) segment (more properly termed a "macromer"), are co-polymerized. As used herein, the phrases "mixture of monomers" and "combination of monomers" are used for simplicity to include a mixture or combination of one or more polymerizable monomers and/or polymerizable macromers.

By way of example only, the polymeric binder can be formed by polymerization of a combination or mixture of suitable monomers/macromers, such as:

A) acrylonitrile, methacrylonitrile, or a combination thereof (i.e., "(meth)acrylonitrile");

B) poly(alkylene glycol) esters of acrylic acid or methacrylic acid, such as poly(ethylene glycol) methyl ether acrylate, poly(ethylene glycol) methyl ether methacrylate, or a combination thereof (i.e., "poly(ethylene glycol) methyl ether (meth)acrylate"); and C) optionally, monomers such as styrene, acrylamide, methacrylamide, etc., or a combination of suitable monomers.

Precursors useful as macromer B include, for example, polyethylene glycol monomethacrylate, polypropylene glycol methyl ether methacrylate, polyethylene glycol ethyl ether methacrylate, polyethylene glycol butyl ether methacrylate, polypropylene glycol hexyl ether methacrylate, polypropylene glycol octyl ether methacrylate, polyethylene glycol methyl ether acrylate, polyethylene glycol ethyl ether acrylate, polyethylene glycol phenyl ether acrylate, polypropylene glycol monoacrylate, polypropylene glycol monomethacrylate, polypropylene glycol methyl ether methacrylate, polypropylene glycol ethyl ether methacrylate, polypropylene glycol butyl ether methacrylate, polyethylene glycol/propylene glycol methyl ether methacrylate, poly(vinyl alcohol) monomethacrylate, poly(vinyl alcohol) monoacrylate, or a mixture thereof. Precursors commonly used as monomer B include poly(ethylene glycol) methyl ether methacrylate, poly(ethylene glycol) acrylate, poly(propylene glycol) methyl ether methacrylate, or a combination thereof. As used herein, the term "(meth)acrylate" with respect to a polymerizable macromer indicates that either an acrylate macromer or a methacrylate macromer, or a combination of acrylate macromers and methacrylate macromers, is suitable for the stated purpose. Also, the phrase "alkyl ether" with respect to a macromer or monomer indicates a lower alkyl ether, generally a ($C_1$–$C_6$) linear or branched saturated alkyl ether, such as, e.g., a methyl ether or ethyl ether.

Suitable monomers that may be used as optional monomer C include, for example, acrylic acid, methacrylic acid, acrylate esters, methacrylate esters such as methyl methacrylate, allyl methacrylate, hydroxyethyl methacrylate, styrene, hydroxystyrene, methacrylamide, or a combination of any of the foregoing. Especially suitable are styrene or methacrylamide, or monomers derived therefrom. Specific examples of suitable monomers include styrene, 3-methyl styrene, 4-methyl styrene, 4-methoxy styrene, 4-acetoxy styrene, alpha-methyl styrene, acrylic acid, methyl acrylate, ethyl acrylate, butyl acrylate, n-hexyl acrylate, methacrylic acid, methyl methacrylate, ethyl methacrylate, n-propyl methacrylate, n-butyl methacrylate, n-pentyl methacrylate, neo-pentyl methacrylate, cyclohexyl methacrylate, n-hexyl methacrylate, 2-ethoxyethyl methacrylate, 3-methoxypropyl methacrylate, allyl methacrylate, vinyl acetate, vinyl butyrate, methyl vinyl ketone, butyl vinyl ketone, vinyl fluoride, vinyl chloride, vinyl bromide, maleic anhydride, maleimide, N-phenyl maleimide, N-cyclohexyl maleimide, N-benzyl maleimide, and mixtures thereof.

By way of example, the polymeric binder described above may be prepared by free radical polymerization. Free radical polymerization is well known to those skilled in the art and is described, for example, in Chapters 20 and 21, of *Macromolecules*, Vol. 2, 2nd Ed., H. G. Elias, Plenum, N.Y., 1984. Useful free radical initiators are peroxides such as benzoyl peroxide, hydroperoxides such as cumyl hydroperoxide and azo compounds such as 2,2'-azo bis-isobutyronitrile (AIBN). Chain transfer agents, such as dodecyl mercaptan, may be used to control the molecular weight of the compound.

In one embodiment, the polymeric binder is a copolymer derived from a combination of polymerizable monomers that includes at least 50 wt.-% of monomer A.

In another embodiment, the polymeric binder is a copolymer derived from: about 55 to about 90 percent (meth) acrylonitrile, by weight; about 5 to about 15 percent poly (ethylene glycol) alkyl ether (meth)acrylate, by weight; and about 5 to about 30 percent styrene, by weight. In yet another embodiment, the polymeric binder is a copolymer derived from a combination of monomers consisting essentially of: about 55 to about 90 percent (meth)acrylonitrile, by weight; about 5 to about 15 percent poly(ethylene glycol) alkyl ether (meth)acrylate, by weight; and about 5 to about 30 percent styrene, by weight. In still another embodiment, the polymeric binder is a copolymer derived from a combination of monomers consisting essentially of: about 55 to about 90 percent acrylonitrile, by weight; about 5 to about 15 percent poly(ethylene glycol) methyl ether methacrylate, by weight; and about 5 to about 30 percent styrene, by weight.

Suitable solvents for free radical polymerization include liquids that are inert to the reactants and which will not otherwise adversely affect the reaction, for example, esters such as ethyl acetate and butyl acetate; ketones such as methyl ethyl ketone, methyl isobutyl ketone, methyl propyl ketone, and acetone; alcohols such as methanol, ethanol, isopropyl alcohol, and butanol; ethers such as dioxane and tetrahydrofuran, and mixtures thereof.

However, the polymeric binder is preferably prepared in hydrophilic medium (water or mixtures of water and alcohol), which may facilitate the formation of particles dispersed in the solvent. Furthermore, it may be desirable to conduct the polymerization in a solvent system that does not completely dissolve the monomer(s) that result in constitutional units that provide hydrophobic character to the polymer backbone, such as acrylonitrile or methacrylonitrile. By way of example, the polymeric binder may be synthesized in a water/alcohol mixture, such as a mixture of water and n-propanol.

All monomers/macromers and polymerization initiators may be added directly to the reaction medium, with the polymerization reaction proceeding at an appropriate temperature determined by the polymerization initiator chosen. Alternatively, the macromers containing the poly(alkylene oxide) segment may be added to a reaction solvent first, followed by the slow addition of monomers at an elevated temperature. The initiator may be added to a monomer mixture, or to a solution of macromer, or both.

Although preparation of the polymeric binder has been described in terms of monomers and macromers that can be used to form the co-polymer, practice of the invention is not limited to the use of copolymers formed by polymerization of a mixture of co-monomers. The polymeric binder may be formed by other routes that will be apparent to those skilled in the art, such as by modification of precursor polymers. In some embodiments, the polymeric binder can be prepared as a graft copolymer, such as where the poly(alkylene oxide) segment is grafted onto a suitable polymeric precursor. Such grafting can be done, for example, by anionic, cationic, non-ionic, or free radical grafting methods.

By way of example only, the polymeric binder can be prepared by first copolymerizing a suitable combination of polymerizable monomers to produce a graftable copolymer, and thereafter grafting a functional group comprising the poly(alkylene oxide) segment onto the graftable copolymer. For instance, a graft copolymer may be prepared by reacting hydroxy-functional or amine functional polyethylene glycol monoalkyl ethers with a polymer having co-reactive groups, including acid chloride, isocyanate and anhydride groups.

Methods of preparation of the graft copolymers suitable for use in the present invention include methods described in the aforementioned U.S. Pat. No. 6,582,882 and co-pending U.S. patent application Ser. No. 10/891,727 (U.S. Pub. App. 2004/0260050), each of which is incorporated by reference in its entirety.

Optional Co-Binder

In addition to the binder described above, the imageable layer may optionally comprise one or more co-binders.

Typical co-binders are water-soluble or water-dispersible polymers, such as, cellulose derivatives such as carboxymethyl cellulose, methylcellulose, hydroxypropyl methylcellulose, hydroxypropyl cellulose, hydroxyethyl cellulose; polyvinyl alcohol; polyacrylic acid; polymethacrylic acid; polyvinyl pyrrolidone; polylactide; polyvinyl phosphonic acid; synthetic co-polymers, such as the copolymer of an alkoxy polyethylene glycol acrylate or methacrylate, for example methoxy polyethylene glycol acrylate or methacrylate, with a monomer such as methyl methacrylate, methyl acrylate, butyl methacrylate, butyl acrylate, or allyl methacrylate; and mixtures thereof.

In some embodiments, the co-binder provides crosslinkable sites. For example, the crosslinkable sites may be ethylenically unsaturated sites.

Tetraarylborate Salt

The imageable element further comprises a tetraarylborate salt. As described above, the tetraarylborate salt is present in the imageable layer in one embodiment. In another embodiment, the imageable element includes an interlayer between the imageable layer and the substrate, and the tetraarylborate salt is present in the interlayer. In yet another embodiment, the imageable element comprises a separate layer between the imageable layer and the substrate, wherein the separate layer consists essentially of the tetraarylborate salt.

Numerous tetraarylborate salts are suitable for the practice of the invention. In general, a tetraarylborate salt comprises a boron center having four bonds to aryl groups. A generic representation of a tetraarylborate salt is $[A^+][B(Ar^1)(Ar^2)(Ar^3)(Ar^4)^-]$, where $Ar^1$ through $Ar^4$ each represent aryl groups, which may be the same or different, and $A^+$ represents a countercation. The aryl groups may be carbocyclic aromatic or heterocyclic aromatic (e.g., comprising an N, O, or S within the aromatic ring) groups. Each aryl group may be monocyclic or polycyclic, and in some tetraarylborate salts the boron center can have more than one single bond to a polycyclic structure (such as a biphenyl).

Each aryl group may be unsubstituted or substituted at one or more ring positions with suitable substituents. Examples of suitable substituents include alkyl groups, cycloalkyl groups, carbocyclic or heterocyclic aromatic groups, hydroxy groups, nitro groups, halogens, haloalkyl groups, alkoxy groups, and haloalkoxy groups.

In one embodiment, the tetraarylborate salt is a tetraphenylborate salt. A tetraphenylborate anion has the general structure $[B(Ph)_4^-]$, where each Ph is a phenyl group which may be unsubstituted or substituted. An example of a suitable tetraphenylborate anion is $[B(C_6H_5)_4^-]$ (commonly known as "tetraphenylborate").

In general, the tetraphenylborate compound can be introduced into a composition as a salt comprising a suitable countercation. The nature of the countercation is not limited. By way of example, alkali ions such as lithium, sodium, and potassium are suitable. Also suitable are ammonium cations, which can be unsubstituted, primary, secondary, tertiary or quaternary. Suitable ammonium cations include, for example, $NH_4^+$, dimethylammonium, diethylammonium, triethylammonium, tributylammonium, and the like. By way of example only, a tetraphenylborate salt having an ammonium counterion is suitable as the tetraarylborate salt in the practice of the present invention.

In one embodiment, the tetraarylborate salt includes a quaternary ammonium counterion. A quaternary ammonium cation has the general structure $[N(R^1)(R^2)(R^3)(R^4)^+]$, where $R^1$ through $R^4$ each represent organic substituents, which may be the same or different. Quaternary ammonium cations are permanently charged, independent of the pH of their environment. Suitable quaternary ammonium counterions include tetraethylammonium and tetrabutylammonium, for example. By way of example only, a tetraphenylborate salt having a quaternary ammonium counterion is suitable as the tetraarylborate salt in the practice of the present invention.

Other cations may be suitable for complexation with the tetraarylborate ion. For example, cationic dyes complexed with tetraarylborate ions are known, as indicated in U.S. Pat. No. 6,413,697 to Melisaris, et al. and Japanese App. JP 2002-062642 of Fuji Photo Film Co. Ltd. When a dye-tetraarylborate salt is used, the dye may form part of the initiator system, or the dye may be present as a colorant.

A salt comprising a radical-generating onium cation and a tetraarylborate anion may also be suitable, such as where the radical-generating onium ion is part of the initiator system. In this embodiment, the tetraarylborate would not be expected to be the primary radical-generating component. Tetraarylborates are less reactive than borates having at least one alkyl substituent, and are not generally useful for generating radicals sufficient to initiate a polymerization reaction upon exposure.

When the tetraarylborate salt is included in the imageable layer, the imageable layer generally comprises about 0.5 wt.-% to about 20 wt.-%, more suitably about 1 wt.-% to about 10 wt.-%, of the tetraarylborate salt. The tetraarylborate anion is generally included in addition to the initiator system described above, but can be introduced as a counterion in conjunction with a suitable cationic initiator (such as a radical-generating onium compound) or a cationic dye.

In one embodiment of the invention, the substrate is treated to have an interlayer, and the interlayer includes the tetraarylborate salt. In the practice of this embodiment, the tetraarylborate salt can be included as an additive in a composition that is used for the interlayer treatment. For example, a composition comprising about 20 parts to about 80 parts tetraarylborate salt per hundred parts solids may be suitable for an interlayer treatment.

In another embodiment of the invention, the imageable element comprises a separate layer between the imageable layer and the substrate. The separate layer may consist essentially of the tetraarylborate salt, or may include other components.

Preparation of an Imageable Element

The imageable elements may be prepared by applying the imageable layer over the hydrophilic surface of the lithographic substrate (or over any layers residing between the substrate and the imageable layer) using conventional techniques. The imageable layer may be applied by any suitable method, such as coating or lamination.

Typically the ingredients of the imageable layer are dispersed or dissolved in a suitable coating solvent, such as water or a mixture of water and an organic solvent such as methanol, ethanol, isopropyl alcohol, and/or acetone. A surfactant, such as a fluorinated surfactant or a polyethoxylated dimethylpolysiloxane copolymer, or a mixture of surfactants may be present to help disperse the other ingredients in the coating solvent. The resulting mixture is coated onto the lithographic substrate by conventional methods, such as spin coating, bar coating, gravure coating, die coating, slot coating, or roller coating.

After coating, the imageable layer is dried to evaporate the solvent. The imageable layer may be air dried at ambient temperature or at an elevated temperature, such as in an oven. Alternatively, the imageable layer may be dried by blowing warm air over the imageable element. The dry coating weight for the imageable layer is typically about 0.2 to about 5.0 g/m$^2$, more suitably from about 0.5 g/m$^2$ to about 1.5 g/m$^2$, and most suitably from about 0.75 g/m$^2$ to about 1.0 g/m$^2$.

Embodiments having multiple layers may be similarly made using conventional methods.

Imaging and Processing of the Imageable Elements

The imageable element is imagewise exposed to produce exposed regions and unexposed regions of the imageable layer. Imagewise exposure initiates a polymerization reaction in exposed regions.

In some embodiments, imagewise exposure is done using infrared imaging radiation. The imageable element may, for example, be imagewise exposed using semiconductor lasers or laser diodes which emit in the near-infrared region of the electromagnetic spectrum. Such a laser beam can be digitally controlled via a computer; i.e. the laser can be turned on or off so that an imagewise exposure of the precursor can be effected via stored digitized information in the computer. Presently, high-performance lasers or laser diodes used in commercially available image setters emit infrared radiation in the wavelength ranges of between 800 and 850 nm or between 1060 and 1120 nm. Other infrared-emitting light sources may also be suitable.

An example of an apparatus comprising a suitable radiation source for imagewise exposure is the Creo TRENDSETTER 3230 from CreoScitex (Burnaby, British Columbia), which contains a laser diode that emits near-infrared radiation at a wavelength of about 830 nm. Other apparatus comprising suitable radiation sources include the CRESCENT 42T PLATESETTER (Gerber Scientific, South Windsor, Conn.), an internal drum platesetter that operates at a wavelength of 1064 nm; and the PlateRite Model 8600 and Model 8800 available from Screen (USA) (Rolling Meadows, Ill.).

Other modes of imaging are also suitable for the practice of the present invention, provided that the necessary energy is supplied to the imageable layer to initiate the polymerization reaction. The imageable element may be thermally imaged using a hot body, for example, such as a conventional apparatus containing a thermal printing head. A suitable apparatus includes at least one thermal head but would usually include a thermal head array.

Imagewise exposure produces an imaged element, which comprises a latent image of exposed regions and complementary unexposed regions. Development of the imaged element to form a printing plate converts the latent image to an image by removing the unexposed regions, revealing the hydrophilic surface of the underlying substrate. To effect development, the imaged element is contacted with a developer solution, most suitably an aqueous developer, or with ink and/or fountain solution. The imageable elements of the present invention include on-press developable plates as well as plates which are intended for other development processes.

Development can take place in a conventional rinse/gum apparatus. The aqueous developer composition is dependent on the nature of the graft copolymer composition. Common components of aqueous developers include surfactants, chelating agents, such as salts of ethylenediamine tetraacetic acid, organic solvents, such as benzyl alcohol, and alkaline components, such as, inorganic metasilicates, organic metasilicates, hydroxides and bicarbonates. The pH of the aqueous developer is preferably within about 5 to about 14, depending on the nature of the graft copolymer composition. Numerous aqueous developer solutions are known to those skilled in the art.

Alternatively, the imaged element can be directly mounted on press after imaging and developed by contact with ink and/or fountain solution during the initial impressions. No separate development step is needed before mounting on press. This eliminates the separate development step along with both the processor and developer, thus simplifying the printing process and reducing the amount of expensive equipment required and chemical waste generated. Typical ingredients of aqueous fountain solutions, in addition to water, include pH buffering systems, such as phosphate and citrate buffers; desensitizing agents, such as dextrin, gum arabic, and sodium carboxymethylcellulose; surfactants and wetting agents, such as aryl and alkyl sulfonates, polyethylene oxides, polypropylene oxides, and polyethylene oxide derivatives of alcohols and phenols; humectants, such as glycerin and sorbitol; low-boiling solvents such as ethanol and isopropanol; sequestrants, such as borax, sodium hexametaphosphate, and salts of ethylenediamine tetraacetic acid; biocides, such as isothiazolinone derivatives; and antifoaming agents.

For on-press imaging, the imageable element is imaged while mounted on a lithographic printing press cylinder, and the imaged element is developed on-press with fountain solution and/or ink during the initial press operation. This method does not comprise a separate development step. This method is especially suitable for computer-to-press applications in which the imageable element (or elements, for multiple color presses) is directly imaged on the plate cylinder according to computer-generated digital imaging information and, with minimum or no treatment, directly prints out regular printed sheets. An example of a direct imaging printing press is the SPEEDMASTER 74-DI press from Heidelberg USA, Inc. (Kennesaw, Ga.).

Once the imageable element has been imaged and developed to form a lithographic printing plate, printing can then be carried out by applying a fountain solution and then lithographic ink to the image on the surface of the plate. The fountain solution is taken up by the unimaged regions, i.e., the surface of the hydrophilic substrate revealed by the imaging and development process, and the ink is taken up by the imaged regions, i.e., the regions not removed by the development process. The ink is then transferred to a suitable receiving medium (such as cloth, paper, metal, glass or plastic) either directly or indirectly using an offset printing blanket to provide a desired impression of the image thereon.

Following development, a postbake may optionally be used to increase press life.

The following Examples illustrate the imageable elements and methods of the present invention.

EXAMPLES

| | |
|---|---|
| Glossary of Chemicals Used in Synthesis of Copolymers and in Coating Formulations | |
| BYK 336: | Modified dimethyl polysiloxane co-polymer in a 25% xylene/methoxypropyl acetate solution, available from Byk-Chemie USA Inc. (Wallingford, Connecticut) |
| DESMODUR N100: | Aliphatic polyisocyanate resin based on hexamethylene diisocyanate, available from Bayer Corp. (Milford, Connecticut) |
| DMBzTB: | N-(4-Benzoylbenzyl)-N,N,-dimethylbenzylammonium tetraphenylborate, prepared according to W. Zhang, K. Feng, X. Wu, D. Martin, and D. C. Neckers, J. Org. Chem. 1999, 64, 458–463 |
| ELVACITE 4026: | 10 wt.-% solution in 2-butanone of a highly-branched poly(methyl methacrylate) available from Lucite International, Inc. (Cordova, Tennessee) |
| $HNBu_3BPh_4$: | Tributylammonium tetraphenylborate, prepared according to F. E. Crane, Anal. Chem. 1956, 28, 1794–1797 |
| IR Dye: | The IR dye used in coating formulations is represented by the formula: 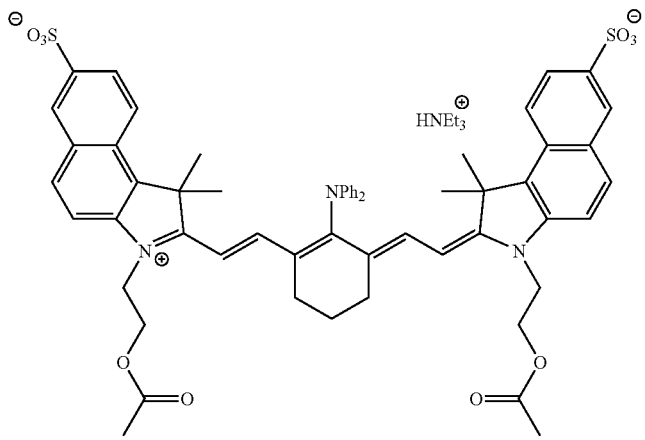 |
| IRGACURE 250: | 75 wt.-% solution of (4-methoxyphenyl)[4-(2-methylpropyl)phenyl] iodonium hexafluorophosphate in propylene carbonate, available from Ciba Specialty Chemicals (Tarrytown, New York) |
| IRGANOX 1035 | Bis[3-(3,5-di-tert-butyl-4-hydroxyphenyl)propionate], a phenolic antioxidant from Ciba Specialty Chemicals |
| KLUCEL M: | 1% Hydroxypropyl cellulose in water, available from Hercules Inc., Aqualon Division (Wilmington, Delaware) |
| MEK: | Methylethyl ketone, also called 2-butanone |
| Mercapto-3-triazole: | Mercapto-3-triazole-1 H, 2, 4 available from PCAS (Paris, France) |
| $NaBPh_4$: | Sodium tetraphenylborate |
| $NBu_4BPh_4$: | Tetrabutylammonium tetraphenylborate |
| $NH_4BPh_4$: | Ammonium tetraphenylborate |
| P3B: | Tetrabutylammonium n-butyltriphenylborate, available from Showa Denko (Kawasaki City, Japan) |
| PAA: | poly(acrylic acid) |
| PEGMA: | Poly(ethylene glycol) methyl ether methacrylate; as a 50 wt.-% solution in water, average Mn ~2080, available from Sigma-Aldrich Corp. (St. Louis, Missouri) |
| PVPA: | poly(vinyl phosphonic acid) |
| SR 399: | Dipentaerythritol pentaacrylate, used here as an 80% solution by weight in MEK; available from Sartomer Co., Inc. (Exton, Pennsylvania) |
| Substrate S1: | Aluminum substrate treated by electrochemical graining and sulfuric acid anodization, post-treated with PVPA to form a hydrophilic surface |
| Substrate S2: | Aluminum substrate treated by brush graining and phosphoric acid anodization, coated with PAA (0.02 g/m$^2$) to form a hydrophilic surface |
| Surfactant 10G: | Non-ionic surfactant available from Arch Chemicals (Cheshire, Connecticut) |
| Triazine A: | 2-(4-methoxyphenyl)-4,6-bis(trichloromethyl)-S-triazine, available from Charkit Chemical Corp. (Darien, Connecticut) |
| Urethane Acrylate: | 80 wt.-% solution in MEK (2-butanone) of a urethane acrylate obtained by reaction of DESMODUR N100 with hydroxyethyl acrylate and pentaerythritol triacrylate |
| VAZO-64: | 2,2'-Azo bis-isobutyronitrile, available from E. I. du Pont de Nemours and Co. (Wilmington, Delaware) |

Synthesis of Copolymers

Synthesis of Copolymer 1

Copolymer 1 was prepared as described in U.S. Pub. App. 2005/0003285. Briefly, a mixture of monomers including PEGMA, styrene, and acrylonitrile is copolymerized in a mixture of n-propanol and water at 70° C. under nitrogen, using VAZO-64 as a polymerization initiator.

Copolymer 1 was used in the following Examples as a dispersion of 24% solids in 80/20 n-propanol/water.

Synthesis of Copolymer N

Copolymer N was prepared in a manner similar to Copolymer 1, except that the reaction product of methacryloyl chloride with JEFFAMINE M-2070 (a polyoxyalkylene monoamine having an average molecular weight of ~2070, available from Huntsman Corp., Houston, Tex.) was used in place of PEGMA. Copolymer N was used in the following Examples as a 23.8% solids solution in 80/20 n-propanol/water.

Synthesis of Copolymer E

Copolymer E was prepared in a manner similar to Copolymer 1, except that the reaction product of chloromethylstyrene with poly(ethyleneglycol) monomethyl ether (Mn ~2000, available from Aldrich) was used in place of PEGMA. Copolymer E was used in the following Examples as a 23.1% solids solution in 80/20 n-propanol/water.

Preparation of Printing Plate Precursors and Printing Plates

Examples E1–E5 and Comparative Examples C1 and C2

A coating composition was prepared according to the formulation set forth in Table 1 (given quantities include solvent fractions of the various components).

TABLE 1

Formulation for coating composition for Examples E1–E5, C1, and C2.

| Component | Parts by Weight |
| --- | --- |
| Copolymer 1 | 4.85 |
| ELVACITE 4026 | 1.93 |
| Urethane Acrylate | 1.20 |
| SR 399 | 1.20 |
| IRGACURE 250 | 0.24 |
| IR Dye | 0.16 |
| Mercapto-3-triazole | 0.11 |
| BYK 336 | 0.35 |
| KLUCEL M | 3.85 |
| n-Propanol | 54.44 |
| MEK | 17.00 |
| Water | 14.67 |

For each of Examples E1–E5, C1 and C2, a 0.008 g portion of the borate compound identified in Table 2 was added to a 5 g aliquot of the coating composition. Each respective composition was coated onto Substrate S1 using a K303 bar coater (R.K. Print-Coat Instruments Ltd., United Kingdom) and a #3 wire wound bar, and dried at approximately 75° C. for 30 s.

The resulting precursors were imaged on a Creo TRENDSETTER 3244 (Creo Products, Burnaby, British Columbia) at 250, 175, and 100 mJ/cm$^2$ and then mounted directly on an AB Dick 9870 Offset Duplicator without further processing. The press was charged with Van Son Rubber Base Black 10850 ink (Van Son Royal Dutch Printing, Holland) and fountain solution containing Varn Litho Etch 142W at 3 oz./gal. and PAR alcohol replacement at 3 oz./gal. (both available from Varn International of Addison, Ill.). After printing 200 copies the press was stopped.

The printed sheets were evaluated for the number of impressions required for the non-image area to be clean of ink, and for the lowest exposure that showed no degradation of the image area after the 200 copies had printed. The results are given in Table 2.

TABLE 2

Press results for printing plates of Examples E1–E5, C1 and C2.

| Example | Borate | No. of impressions for clean background | Lowest exposure (mJ/cm$^2$) for which no degradation is observed after 200 copies |
| --- | --- | --- | --- |
| C1 | (none) | <5 | all exposures showed degradation |
| E1 | NaBPh$_4$ | 20 | 175 |
| E2 | NH$_4$BPh$_4$ | 100 | 100 |
| E3 | HNBu$_3$BPh$_4$ | <5 | 100 |
| E4 | NBu$_4$BPh$_4$ | 15 | 100 |
| E5 | DMBzTB | <5 | 175 |
| C2 | P3B | >200 | 100 |

Examples E6–E10 and Comparative Examples C3 and C4

Printing plates for Examples E6–E10, C3 and C4 were made and evaluated as for Examples E1–E5, except Substrate S2 was used and the precursors were imaged at 150, 100, and 75 mJ/cm$^2$. The results are given in Table 3.

TABLE 3

Press results for printing plates of Examples E6–E10, C3 and C4.

| Example | Borate | No. of impressions for clean background | Lowest exposure (mJ/cm$^2$) to show no degradation after 200 copies |
| --- | --- | --- | --- |
| C3 | (none) | 15 | 150 |
| E6 | NaBPh$_4$ | 10 | 75 |
| E7 | NH$_4$BPh$_4$ | 25 | 75 |
| E8 | HNBu$_3$BPh$_4$ | <5 | 75 |
| E9 | NBu$_4$BPh$_4$ | 15 | 75 |
| E10 | DMBzTB | 10 | 75 |
| C4 | P3B | >200 | 75 |

Examples E11–E15 and Comparative Examples C5 and C6

For each of Examples E11–E15 and Comparative Examples C5 and C6, a coating composition was prepared according to the formulation set forth in Table 4 (given quantities include solvent fractions of the various components), using the borate compound indicated in Table 5. Each composition was slot-coated onto Substrate S1 at 2.5 mL/ft$^2$ and dried at 120° F. to yield a precursor.

TABLE 4

Formulation for coating composition used in Examples E11–E34 and C5–C12.

| Component | Parts by Weight |
| --- | --- |
| Copolymer 1 | 4.85 |
| ELVACITE 4026 | 1.93 |
| Urethane Acrylate | 1.11 |
| SR 399 | 1.11 |
| IRGACURE 250 | 0.24 |

TABLE 4-continued

Formulation for coating composition used in Examples E11–E34 and C5–C12.

| Component | Parts by Weight |
| --- | --- |
| IR Dye | 0.16 |
| Borate compound | 0.15 |
| Mercapto-3-triazole | 0.11 |
| BYK 336 | 0.35 |
| KLUCEL M | 3.85 |
| n-Propanol | 54.42 |
| MEK | 17.05 |
| Water | 14.67 |

The precursors were placed in an oven at 48° C. for five days to simulate aging. Precursors were then imaged and mounted on a press as in Examples E1–E5. The printed sheets were evaluated for the number of impressions required for the non-image area to be clean of ink. The results are given in Table 5.

TABLE 5

Press results for printing plates of Examples E11–E15, C5 and C6.

| Example | Borate | No. of impressions for clean background |
| --- | --- | --- |
| C5 | (none) | 10 |
| E11 | NaBPh$_4$ | 100 |
| E12 | NH$_4$BPh$_4$ | 25 |
| E13 | HNBu$_3$BPh$_4$ | 15 |
| E14 | NBu$_4$BPh$_4$ | 20 |
| E15 | DMBzTB | 50 |
| C6 | P3B | 150 |

Examples E16–E20 and Comparative Examples C7 and C8

Printing plates for Examples E16–E20, C7 and C8 were made and evaluated as for Examples E11–E15, except Substrate S2 was used. The results are given in Table 6.

TABLE 6

Press results for printing plates of Examples E16–E20, C7 and C8.

| Example | Borate | No. of impressions for clean background |
| --- | --- | --- |
| C7 | (none) | 15 |
| E16 | NaBPh$_4$ | 20 |
| E17 | NH$_4$BPh$_4$ | 25 |
| E18 | HNBu$_3$BPh$_4$ | 10 |
| E19 | NBu$_4$BPh$_4$ | 15 |
| E20 | DMBzTB | 20 |
| C8 | P3B | >200 |

Examples E21, E22 and Comparative Example C9

For each of Examples E21, E22, and Comparative Example C9, a coating composition was prepared according to the formulation set forth in Table 4 (given quantities include solvent fractions of the various components), using the borate compound indicated in Table 7. Each composition was slot-coated onto Substrate S1 at 2.5 mL/ft$^2$ and dried at 120° F. to yield a precursor.

The precursors were imaged on a Creo TRENDSETTER 3244 at a fixed laser power while varying the drum speed such that a series of solid images were formed at exposures ranging from 39 to 293 mJ/cm$^2$. The imaged precursors were mounted on a Komori SPRINT 26 offset printing press without further processing. The press was charged with Equinox Process Black ink (Graphic Ink Company, Inc., Salt Late City, Utah) and fountain solution containing Vam Litho Etch 142W at 3 oz./gal. and PAR alcohol replacement at 3 oz./gal. After printing about 500 to 700 copies the press was stopped.

The density of the solid images on the last printed sheet was measured with an X-Rite densitometer, and the density was plotted as a function of exposure dose. The resulting data was normalized such that for each plate example the highest density print was 1.0 and the blank paper 0.0001. The data reported in Table 7 are the minimum exposure required to achieve 80% of the full normalized print density.

TABLE 7

Minimum exposures required for 80% of full density for Examples E21, E22 and C9.

| Example | Borate | Exposure (mJ/cm$^2$) |
| --- | --- | --- |
| C9 | (none) | 204 |
| E21 | NaBPh$_4$ | 62 |
| E22 | DMBzTB | 54 |

Examples E23–E27 and Comparative Example C10

Printing plates for Examples E23–E27 and C10 were made and evaluated as for Examples E21–E22, except Substrate S2 was used and solid images were formed at exposures ranging from 25 to 250 mJ/cm$^2$. The results are given in Table 8.

TABLE 8

Minimum exposures required for 80% of full density for Examples E23–E27 and C10.

| Example | Borate | Exposure (mJ/cm$^2$) |
| --- | --- | --- |
| C10 | (none) | 119 |
| E23 | NaBPh$_4$ | 52 |
| E24 | NH$_4$BPh$_4$ | 68 |
| E25 | HNBu$_3$BPh$_4$ | 56 |
| E26 | NBu$_4$BPh$_4$ | 69 |
| E27 | DMBzTB | 53 |

Examples E28, E29 and Comparative Example C11

For each of Examples E28, E29, and Comparative Example C11, a coating composition was prepared according to the formulation set forth in Table 4 (given quantities include solvent fractions of the various components), using the borate compound indicated in Table 9. Each composition was slot-coated onto Substrate S1 at 2.5 mL/ft$^2$ and dried at 120° F. to yield a precursor.

The precursors were imaged on a Creo TRENDSETTER 3244 at the exposure indicated in Table 9. The imaged precursors were mounted on a Miehle 29 offset printing press without further processing. The press was charged with a custom-made black ink containing added abrasives to increase the rate of plate wear, and fountain solution containing Varn Litho Etch 142W at 3 oz./gal. and PAR alcohol replacement at 3 oz./gal.

The number of copies printed before degradation of the solid image was observed, and is reported as "Runlength" in Table 9.

TABLE 9

Runlengths for accelerated wear tests for Examples E28, E29 and C11.

| Example | Borate | Exposure (mJ/cm$^2$) | Runlength |
|---|---|---|---|
| C11 | (none) | 300 | 200 |
| E28 | NaBPh$_4$ | 150 | 4000 |
| E29 | DMBzTB | 150 | 3000 |

Examples E30–E34 and Comparative Example C12

Printing plates for Examples E30–E34 and C12 were made and evaluated as for Examples E28–E29, except Substrate S2 was used. The results are given in Table 10.

TABLE 10

Runlengths for accelerated wear tests for Examples E30–E34 and C12.

| Example | Borate | Exposure (mJ/cm$^2$) | Runlength |
|---|---|---|---|
| C12 | (none) | 300 | 10,000 |
| E30 | NaBPh$_4$ | 150 | 18,000 |
| E31 | NH$_4$BPh$_4$ | 150 | 13,000 |
| E32 | HNBu$_3$BPh$_4$ | 150 | 19,000 |
| E33 | NBu$_4$BPh$_4$ | 150 | 19,000 |
| E34 | DMBzTB | 150 | 19,000 |

Examples E35 and E36

For each of Examples E35 and E36, a coating composition was prepared according to the formulation set forth in Table 11 (given quantities include solvent fractions of the various components). Each composition was coated onto Substrate S1 and dried to provide a coating weight of 0.88 g/m$^2$, producing a precursor.

TABLE 11

Formulations for coating compositions used in Examples E35 and E36.

| | Parts by Weight | |
|---|---|---|
| Component | Example E35 | Example E36 |
| Copolymer N | 4.89 | — |
| Copolymer E | — | 5.04 |
| ELVACITE 4026 | 1.93 | 1.93 |
| Urethane Acrylate | 1.11 | 1.11 |
| SR 399 | 1.11 | 1.11 |
| IRGACURE 250 | 0.18 | 0.18 |
| IR Dye | 0.15 | 0.15 |
| NBu$_4$BPh$_4$ | 0.15 | 0.15 |
| Mercapto-3-triazole | 0.11 | 0.11 |
| BYK 336 | 0.35 | 0.35 |
| KLUCEL M | 3.86 | 3.86 |
| n-Propanol | 54.71 | 54.59 |
| MEK | 17.05 | 17.05 |
| Water | 14.40 | 14.67 |

The precursors were subjected to accelerated aging at 38° C. and 80% relative humidity for 5 days.

Precursors for Example E35 were imaged on a Creo TRENDSETTER 3230 at 10 W laser power at 158 and 79 rpm (corresponding to exposures of 150 and 300 mJ/cm$^2$, respectively). Precursors for Example E36 were imaged at 5.25 W laser power at 124, 62 and 41 rpm (corresponding to exposures of 100, 200 and 300 mJ/cm$^2$, respectively).

Each imaged precursor was mounted on an AB Dick 9870 Offset Duplicator. For each precursor, the background cleaned out by 50 impressions, and strong images were obtained at all exposures.

Example E37 and Comparative Example C13.

A coating composition was prepared according to the formulation given in Table 12 (given quantities include solvent fractions of the various components).

TABLE 12

Formulation for coating compositions used in Examples E37, E38, C13, and C14.

| Component | Parts by Weight |
|---|---|
| Copolymer 1 | 4.81 |
| ELVACITE 4026 | 1.93 |
| Urethane Acrylate | 1.11 |
| SR 399 | 1.11 |
| IRGACURE 250 | 0.18 |
| IR Dye | 0.15 |
| Mercapto-3-triazole | 0.11 |
| BYK 336 | 0.35 |
| KLUCEL M | 3.86 |
| n-Propanol | 54.86 |
| MEK | 17.08 |
| Water | 14.45 |

For Example E37, Substrate S1 was coated with a solution of sodium tetraphenylborate in 4% isopropanol/water and dried to yield a coating weight of 0.022 g/m$^2$. The coating composition was then applied over this coating and dried to yield a coating weight of 0.84 g/m$^2$, producing a precursor.

For Comparative Example C13, the coating composition was applied to Substrate S1 and dried to yield a coating weight of 0.84 g/m$^2$, producing a precursor.

Each of precursors E37 and C13 was imaged on a Creo TRENDSETTER 3230 at a laser power of 5.25 W at 166, 83 and 41 rpm (corresponding to exposures of 75, 150 and 300 mJ/cm$^2$, respectively). Each imaged precursor was mounted on an AB Dick 9870 Offset Duplicator, and 200 impressions were printed.

All three images on the E37 plates (i.e., having a separate layer consisting of a tetraarylborate) survived intact, while only the image corresponding to the highest exposure was intact after 200 impressions for the Comparative Example C13 plate.

Example E38 and Comparative Example C14.

To prepare Substrate S3, a brush-grained and phosphoric acid-anodized aluminum substrate was coated with a composition according to the formulation given in Table 13 and dried to yield a coating weight of 0.022 g/m$^2$.

TABLE 13

Coating solution for Substrate S3.

| Component | Parts by Weight |
|---|---|
| PAA | 0.16 |
| Sodium tetraphenylborate | 0.16 |
| Surfactant 10G | 0.01 |
| Water | 99.67 |

For Example E38, the coating composition prepared according to the formulation given in Table 12 was applied to substrate S3 and dried to yield a coating weight of 0.84 g/m$^2$, producing a precursor.

For Comparative Example C14, the coating composition prepared according to the formulation given in Table 12 was applied to substrate S2 and dried to yield a dry coating weight of 0.84 g/m$^2$, producing a precursor.

Each of precursors E38 and C14 was imaged on a Creo TRENDSETTER 3230 at a laser power of 5.25 W at 249, 124 and 83 rpm (corresponding to exposures of 50, 100 and 150 mJ/cm$^2$, respectively). Each imaged precursor was mounted on an AB Dick 9870 Offset Duplicator, and 200 impressions were printed.

All three images on the E38 plates (i.e., having an interlayer including a tetraarylborate) survived intact, while only the images corresponding to exposures of 100 and 150 mJ/cm$^2$ were intact after 200 impressions for the Comparative Example 14 plate.

Example E39 and Comparative Examples C15 and C16

A coating composition was prepared according to the formulation given in Table 1, except the IRGACURE 250 was left out. To a 5 g aliquot of the coating composition was added sodium tetraphenylborate and/or Triazine A as indicated in Table 14.

Precursors were then made and imaged as in Examples E6-E10 using the resulting compositions. Qualitative results of press tests are given in Table 14.

TABLE 14

Press results for Example E39, C15, and C16.

| Example | Triazine or Borate compound | Qualitative observation of printed image |
|---|---|---|
| C15 | 0.012 g Triazine A | no printed image resulted for any exposure |
| C16 | 0.009 g NaBPh$_4$ | no printed image resulted for any exposure |
| E39 | 0.012 g Triazine A plus 0.008 g NaBPh$_4$ | weak to moderate printed image resulted for all exposures |

Examples E40–E45

For each of Example E40–E45, a coating compositions prepared according to the formulation given in Table 15 was slot-coated onto Substrate S2 at 2.5 mL/ft$^2$ and dried at 120° F. to yield a precursor. Each precursor was imaged on a Creo TRENDSETTER 3244 at 150 mJ/cm$^2$.

TABLE 15

Formulation for coating compositions used in Examples E40–E45.

| Component | Parts by Weight | | | | | |
|---|---|---|---|---|---|---|
| | E40 | E41 | E42 | E43 | E44 | E45 |
| Copolymer 1 | 4.85 | 4.81 | 4.77 | 4.85 | 4.81 | 4.77 |
| ELVACITE 4026 | 1.93 | 1.93 | 1.93 | 1.93 | 1.93 | 1.93 |
| Urethane Acrylate | 1.13 | 1.13 | 1.13 | 1.11 | 1.11 | 1.11 |
| SR 399 | 1.13 | 1.13 | 1.13 | 1.11 | 1.11 | 1.11 |
| IRGACURE 250 | 0.25 | 0.25 | 0.25 | 0.25 | 0.25 | 0.25 |
| IR Dye | 0.15 | 0.15 | 0.15 | 0.15 | 0.15 | 0.15 |
| NaBPh4 | 0.12 | 0.12 | 0.12 | — | — | — |
| NBu$_4$BPh$_4$ | — | — | — | 0.15 | 0.15 | 0.15 |
| Mercapto-3-triazole | 0.11 | 0.11 | 0.11 | 0.11 | 0.11 | 0.11 |
| BYK 336 | 0.35 | 0.35 | 0.35 | 0.35 | 0.35 | 0.35 |
| KLUCEL M | 3.86 | 3.86 | 3.86 | 3.86 | 3.86 | 3.86 |
| n-Propanol | 54.41 | 54.43 | 54.46 | 54.41 | 54.43 | 54.46 |
| MEK | 17.04 | 17.04 | 17.04 | 17.05 | 17.05 | 17.05 |
| Water | 14.67 | 14.68 | 14.68 | 14.67 | 14.68 | 14.68 |
| IRGANOX 1035 | — | 0.01 | 0.02 | — | 0.01 | 0.02 |

After imaging the plates were cut in half. One half of each plate was exposed to 47 ft.-candles of fluorescent light for 8.5 hours. Both halves of each plate were then mounted on a Komori SPRINT 26 offset printing press without further processing. The press was charged with Equinox Process Black ink and fountain solution containing Varn Litho Etch 142W at 3 oz./gal. and PAR alcohol replacement at 3 oz./gal.

Each half-plate that was not exposed to white light printed clean in the background by 5 impressions. Each half-plate that contained IRGANOX 1035 (E41, E42, E44, and E45) and were exposed to white light also printed clean in the background by 5 impressions. Each half-plate that did not contain IRGANOX 1035 (E40 and E43) and was exposed to white light printed ink in the non-image areas even after 500 impressions.

This invention may take on various modifications and alterations without departing from the spirit and scope thereof. Accordingly, it is to be understood that this invention is not to be limited to the above-described, but it is to be controlled by the following claims and any equivalents thereof. It is also to be understood that this invention may be suitably practiced in the absence of any element not specifically disclosed herein.

In describing preferred embodiments of the invention, specific terminology is used for the sake of clarity. The invention, however, is not intended to be limited to the specific terms so selected, and it is to be understood that each term so selected includes all technical equivalents that operate similarly.

What is claimed is:

1. An imageable element comprising:
   a lithographic substrate; and
   disposed on the substrate, an imageable layer including
   a) a radically polymerizable component;
   b) an initiator system capable of generating radicals sufficient to initiate a polymerization reaction upon exposure to imaging radiation; and
   c) a polymeric binder having a hydrophobic backbone and including both:
      i) constitutional units having a pendant cyano group attached directly to the hydrophobic backbone, and
      ii) constitutional units having a pendant group including a hydrophilic poly(alkylene oxide) segment; wherein the imageable element further comprises a tetraarylborate salt.

2. The imageable element of claim 1, wherein the tetraarylborate salt is present in the imageable layer.

3. The imageable element of claim 1, wherein the imageable element includes an interlayer between the imageable layer and the substrate, and the tetraarylborate salt is present in the interlayer.

4. The imageable element of claim 1, wherein the imageable element further comprises a separate layer between the imageable layer and the substrate, wherein the separate layer consists essentially of the tetraarylborate salt.

5. The imageable element of claim 1, wherein the tetraarylborate salt is a tetraphenylborate salt.

6. The imageable element of claim 1, wherein the tetraarylborate salt includes an ammonium counterion.

7. The imageable element of claim 1, wherein the substrate is a phosphoric acid-anodized aluminum sheet.

8. The imageable element of claim 1, wherein the initiator system is capable of generating radicals sufficient to initiate a polymerization reaction upon exposure to infrared radiation in the range from about 800 nm to about 1200 nm.

9. The imageable element of claim 1, wherein the initiator system comprises a photothermal conversion material and a radical generator.

10. The imageable element of claim 1, wherein the poly(alkylene oxide) segment is a poly(ethylene oxide) segment.

11. The imageable element of claim 1, wherein the polymeric binder further includes constitutional units having pendant unsubstituted or substituted phenyl groups attached directly to the hydrophobic backbone.

12. The imageable element of claim 1, wherein the polymeric binder is present in the imageable layer in the form of discrete particles.

13. The imageable element of claim 1, wherein the imageable element further comprises a hindered phenolic antioxidant to reduce the white-light sensitivity of the imageable layer.

14. A method for making a printing plate, comprising the steps of:
  providing an imageable element comprising:
    a lithographic substrate; and
    disposed on the substrate, an imageable layer including
      a) a radically polymerizable component;
      b) an initiator system capable of generating radicals sufficient to initiate a polymerization reaction upon exposure to imaging radiation; and
      c) a polymeric binder having a hydrophobic backbone and including both:
        i) constitutional units having a pendant cyano group attached directly to the hydrophobic backbone, and
        ii) constitutional units having a pendant group including a hydrophilic poly(alkylene oxide) segment;
    wherein the imageable element further comprises a tetraarylborate salt;
  imagewise exposing the element to imaging radiation;
  mounting the element on a lithographic printing press; and
  developing the element by contacting the element with ink and/or fountain solution, to yield the printing plate.

15. The method of claim 14, wherein the tetraarylborate salt is present in the imageable layer.

16. The method of claim 14, wherein the polymeric binder is present in the imageable layer in the form of discrete particles.

17. The method of claim 14, wherein the imaging radiation is infrared radiation in the range from about 800 nm to about 1200 nm.

18. An imageable element comprising:
  a lithographic substrate;
  disposed on the substrate, an imageable layer including
    a) a radically polymerizable component;
    b) an initiator system capable of generating radicals sufficient to initiate a polymerization reaction upon exposure to imaging radiation; and
    c) a polymeric binder having a hydrophobic backbone and constitutional units having a pendant group including a hydrophilic poly(alkylene oxide) segment; and
  a tetraarylborate salt in a layer between the imageable layer and the substrate.

19. The imageable element of claim 18, wherein the imageable element includes an interlayer between the imageable layer and the substrate, and the tetraarylborate salt is present in the interlayer.

20. The imageable element of claim 18, wherein the imageable element comprises a separate layer between the imageable layer and the substrate, wherein the separate layer consists essentially of the tetraarylborate salt.

* * * * *